United States Patent [19]
Chatterjee

[11] Patent Number: 4,948,461
[45] Date of Patent: Aug. 14, 1990

[54] DRY-ETCHING METHOD AND PLASMA

[75] Inventor: Dilip K. Chatterjee, Rochester, N.Y.

[73] Assignee: Eastman Kodak Company, Rochester, N.Y.

[21] Appl. No.: 422,205

[22] Filed: Oct. 16, 1989

[51] Int. Cl.⁵ .................. B44C 1/22; C03C 15/00; C03C 25/06; C23F 1/00
[52] U.S. Cl. .................. 156/643; 156/646; 156/657; 156/345; 204/192.37; 252/79.1
[58] Field of Search ............... 156/643, 646, 656, 657, 156/662, 345; 252/79.1; 427/38, 39; 204/192.32, 192.35, 192.37, 298

[56] References Cited

U.S. PATENT DOCUMENTS

| | | | |
|---|---|---|---|
| 4,375,385 | 3/1983 | Halon | 252/79.1 X |
| 4,624,736 | 11/1986 | Gee et al. | 156/643 |
| 4,631,105 | 12/1986 | Carroll et al. | 156/345 |

*Primary Examiner*—William A. Powell
*Attorney, Agent, or Firm*—William J. Davis

[57] ABSTRACT

An etching plasma containing a reactive fluorine-containing gas and atoms or ions of a heavy metal is particularly useful in a method of removing material from a substrate by reactive ion etching.

9 Claims, 1 Drawing Sheet

DRY-ETCHING METHOD AND PLASMA

BACKGROUND OF THE INVENTION

1. Field of the Invention

The Present invention relates to a dry-etching method using a novel etching plasma.

2. Description of the Prior Art

Etching techniques are known in the art that involve selective removal of materials by an interaction with chemically reactive ion species created by a radio frequency (RF) power-induced glow discharge maintained in the etching chamber. Such reactive ion etching (RIE) is becoming increasingly important in state of the art micropatterning processes including etching of substrates such as semiconductor wafers and other workpieces including, e.g., etching of $SiO_2$, SiC, $Si_3N_4$, etching of passivation layers or diffusion barrier layers, and stripping of photoresists.

In a conventional RIE method, the surface of a substrate to be etched is covered with a mask leaving selected areas of the substrate exposed. The substrate is inserted into a chamber containing a chemically reactive gas, such as $CF_4$, in admixture with $O_2$. A plasma is created by applying an RF voltage across the gas to cause the gas to dissociate and form various species comprising positive and negative ions, reactive atoms, such as fluorine, and radicals. The plasma reacts with the surface and forms volatile products leaving an etched surface in the areas exposed by the mask.

The industry acceptance of RIE has been based partly on its ability to provide good etch selectivity and profiles. However, compared to other etching processes, RIE provides relatively low etching rates. To overcome such low etch rates, RIE usually requires batch processing for economically attractive throughput. This introduces problems of end-point detection, control of uniformity and complexity of implementation.

Thus, there is a need for increasing the etching rate of a reactive ion etching plasma which does not adversely affect the surface quality or chemical sensitivity of the etched substrate.

SUMMARY OF THE INVENTION

I have discovered that the etching rate of a reactive ion etching plasma can be increased by enriching the reactive plasma with atoms or ions of a heavy metal.

More specifically, in accordance with this invention, there is provided an etching plasma for removing material from a substrate, the plasma comprising a reactive fluorine-containing gas and atoms or ions of a heavy metal, the metal preferably having an atomic weight of at least about fifty-eight (58). The plasma substantially increases the rate of material removal from a substrate during reactive ion etching compared to the same plasma not containing the heavy metal.

In accordance with another aspect of the invention, there is provided a method of preparing an aspherized surface from a silicon carbide substrate by etching the substrate with an etching plasma containing a reactive fluorine-containing gas comprising atoms or ions of a heavy metal. This method is particularly useful in the fabrication of aspherized mold surfaces for single step molding of glass lenses. The use of RIE in such fabrication process provides smoother etched surfaces of higher optical quality as compared to physical sputtering.

It is an advantageous feature of this invention that semiconductors such as SiC which are generally resistant to RIE etching plasmas can be more readily etched.

It is another advantageous feature of this invention that the method provides etched substrates having good surface quality and chemical insensitivity.

DETAILED DESCRIPTION OF PREFERRED EMBODIMENTS

In accordance with this invention, atoms or ions of a heavy metal are incorporated into an etching plasma comprising a reactive fluorine-containing gas. The atoms or ions incorporated into the reactive plasma are of a heavy metal, preferably of a metal having an atomic weight of at least about 58. Particularly preferred metals include Ni, Cu, Mo, Pd, Ag, Pt and Au. Cu and Ag are most preferred.

The etching plasma of this invention contains at least one reactive fluorine-containing gas. Preferred fluorine-containing gases include $CF_4$, $F_2$, $XeF_2$, $XeF_6$ and $NF_3$.

The above gases can be used alone or in combination with gases such as $O_2$ or $H_2$. Preferred plasmas include $CF_4$ and $O_2$, $XeF_6$ and $O_2$ and $NF_3$ and $H_2$. The most preferred plasma includes a mixture of $CF_4$ and $O_2$.

It is contemplated that the atoms or ions of the heavy metal can be incorporated into the plasma by a variety of means. For example, such atoms or ions can be incorporated into the etching plasma by sputtering as described below. Alternatively, the atoms or ions can be incorporated into the plasma by a secondary glow discharge source located inside the main plasma etching apparatus. Effective amounts of the heavy metal atoms or ions are believed to be from 1 to 50% by weight of the total plasma. Preferred amounts of the heavy metal are believed to be 10–40%, more preferably 20–30% by weight of the total plasma.

While applicant does not wish to be bound by any particular theoretical mechanism, it is believed that the addition of copper or other heavy metal atoms or ions to the etching plasma increases the rate of momentum transfer to the substrate surface to be etched, thereby enhancing the physical erosion (etching) rate. In this manner, higher atomic weight metal atoms are believed to generate greater momentum transfer and result in greater etching rate increases.

As is known to those skilled in the art, the material removal rate by reactive ion etching depends on a wide variety of factors, such as the material to be etched, composition, pressure and flow rate of the feed gases, RF power, the surface temperature of the substrate, the electrode configuration, etc.

In experiments with etching of SiC, applicant has found that the etch rate can be increased by increasing the concentration of fluorine ions in the plasma, i.e., by adjusting the $CF_4/O_2$ ratio in the reactive gas mixture. For example, a mixture of 60% $CF_4$ and 40% $O_2$ (by volume) increased the etch rate 20% compared to a 50:50 gas mixture. However, this optimized etch rate still was not fully acceptable and was significantly increased in accordance with this invention. Applicant has found that the etching of SiC requires the presence of $O_2$ in the plasma, presumably for the oxidation of carbon which takes place during etching.

Figure 1:
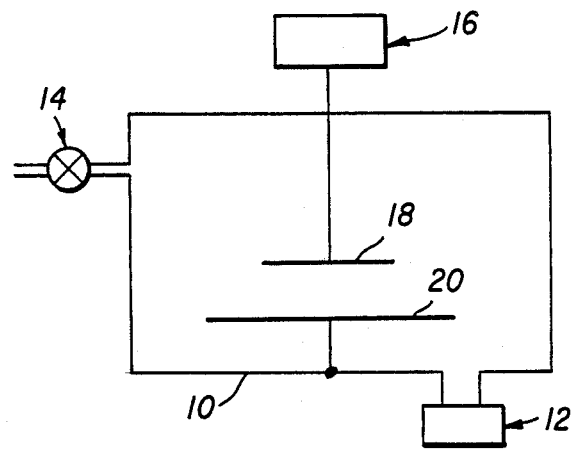
FIG. 1 is a schematic illustration of a conventional plasma etching apparatus.
Figure 2:
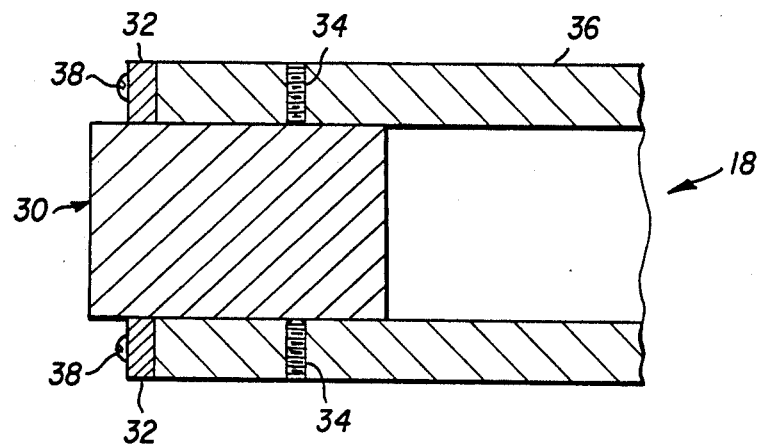
FIG. 2 is a cross-sectional view of a cathode assembly useful in conjunction with the apparatus of FIG. 1 in carrying out the method of this invention.

Several approaches to provide etching plasmas are known and are useful in the practice of this invention. A preferred approach is an asymmetric parallel plate RF sputtering system illustrated schematically in FIG. 1. Such a system is particularly advantageous in that it is useful in conjunction with virtually all vacuum compatible materials, i.e., conductors, semiconductors and insulators. Furthermore, the power supplies, tuning networks, monitors and controllers are all readily available commercially at moderate cost. With reference to FIG. 1, the basic system components include vacuum enclosure 10, suitable vacuum pumping means 12 and gas inlet metering valve 14, which together provide a low pressure (e.g., 5 to 30 microns of Hg) for the reactive gas, such as a mixture of $CF_4$ and $O_2$, to be ionized. Power supply 16 is used to apply a large potential, for example, several hundred volts, between cathode 18 and anode 20, which establishes a glow discharge between the electrodes. FIG. 2 depicts an exemplary cathode assembly. Sample 30, such as a SiC substrate, to be etched, is securely affixed to water-cooled housing 36 by suitable means, such as set screws 34. Annular plate 32 of the heavy metal, for example of Cu, of which atoms or ions are to be incorporated into the plasma is set about the sample and is securely affixed to housing 36 by suitable means such as screws 38. Annular plate 32 prevents erosion of the expensive cathode assembly and increases the etch rate of the sample by enriching the plasma with atoms or ions of the heavy metal. Such atoms or ions are sputtered from the annular plate and take part in the physical sputtering process of the SiC.

I have found that the above-described etching plasma is particularly useful in the fabrication of aspherized mold surfaces for single step molding of glass lenses. Silicon carbide is a preferred refractory compound for such molds and presents a particular technological challenge in terms of its unusual resistance to etching plasmas. Further, the surface quality of the etched mold is particularly critical in such application. The workpiece preferably is etched with the above-described plasma through a rotating mask. The mask is designed so that the angular opening at a particular radius is proportional to the amount of material to be removed at such radius.

The following examples further illustrate this invention.

EXAMPLES 1 AND 2 AND CONTROLS A-C

A SiC workpiece was attached to a fixture made of stainless steel which served as a cathode in an etching system as described for FIG. 1 above. A sacrificial annular stainless steel plate was affixed so as to cover the cathode fixture leaving only the workpiece exposed to the plasma. In this manner, erosion of the expensive cathode is minimized. A gaseous mixture of 50% $CF_4$ and 50% $O_2$ by volume) was ionized. The power, gas flow rate and pressure were optimized for the equipment configuration by techniques known to those skilled in the art. The etch rate (Control A) was determined to be 1000.Å/min.

The procedure of Control A was repeated except that a gaseous mixture of 60% $CF_4$ and 40% $O_2$ (by volume) was ionized. The etch rate (Control B) was determined to be 1200 Å/min.

The procedure of Comparative Example B was repeated except that the face of the cathode fixture was covered with a sacrificial annular OFHC (oxygen free high conductivity) copper plate. The etching rate (Example 1) increased to 1400 Å/min. The plate provided a source of copper atoms or ions for the plasma.

The procedure of Example 1 was repeated except that the face of the cathode fixture was covered with a sacrificial annular silver plate. The etching rate (Example 2) was determined to be 1400 Å/min. The plate provided a source of silver atoms or ions for the plasma.

Examples 1 and 2 demonstrate that a reactive ion etching plasma in accordance with this invention substantially increases the rate of material removed from a substrate during reactive ion etching.

The procedure of Control B was repeated except that the face of the cathode fixture was covered with a sacrificial annular aluminum plate (Control C). The etch rate remained the same, i.e., 1200 Å/min.

EXAMPLE 3

The plasma described in Example 1 above was used to etch an aspherized surface from a SiC substrate through a rotating mask. The mask is designed so that the angular opening at a particular radius is proportional to the amount of material to be removed at such radius. Various materials such as Al, Mn, Cu, Mo were used as masks. From the rigidity and dimensional stability points of view, Al and Cu were discarded. However, masks made of Cu and Mo enriched the formula with heavy ions/atoms and increased significantly the rate of etching. The etched surface was of excellent quality and was useful as a mold for preparing aspheric glass lenses in a single step process. The optical surface quality of the etched surface was reproduced on the lenses.

The invention has been described in detail with particular reference to certain preferred embodiments thereof, but it will be understood that variations and modifications can be effected within the spirit and scope of the invention.

What is claimed:

1. In a method of removing material from a non-metallic substrate by reactive ion etching using an etching plasma containing a reactive fluorine-containing gas, the improvement comprising incorporating into said plasma atoms or ions of a metal having an atomic weight of at least about fifty-eight (58).

2. The method of claim 1 wherein said metal is selected from the group consisting of Ni, Cu, Pd, Ag, Pt and Au.

3. The method of claim 1 wherein said metal is Cu, Ag or Mo.

4. The method of claim 1 wherein said etching plasma comprises $CF_4$ and $O_2$.

5. The method of claim 1 wherein said material being removed is silicon carbide.

6. In an etching plasma containing a reactive fluorine containing gas adapted for removing material from a non metallic substrate by reactive ion etching, the improvement wherein said plasma comprises atoms or ions of a metal having an atomic weight of at least about fifty eight (58).

7. A method of preparing an aspherized surface from a silicon carbide substrate by etching said substrate with an etching plasma containing a reactive fluorine containing gas and atoms or ions of a metal having an atomic weight of at least about fifty-eight (58).

8. The method of claim 7 wherein said substrate is etched through a rotating mask.

9. The method of claim 8 wherein said mask is made of Cu or Mo.

* * * * *